(12) United States Patent
Lewis et al.

(10) Patent No.: US 6,373,238 B2
(45) Date of Patent: *Apr. 16, 2002

(54) THREE-PHASE ELECTRICAL POWER MEASUREMENT SYSTEM INCLUDING THREE TRANSFORMERS AND A MEASUREMENT CIRCUIT TO CALCULATE THE POWER THEREOF

(75) Inventors: Jim Lewis; Paul Stoffregen, both of Portland, OR (US)

(73) Assignee: Veris Industries, LLC, Portland, OR (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/110,634

(22) Filed: Jul. 6, 1998

(51) Int. Cl.[7] .............................................. G01R 21/06
(52) U.S. Cl. ....................................... 324/107; 127/142
(58) Field of Search ............................ 324/127, 117 R, 324/117 H, 126, 251, 252, 142, 158.1, 107; 327/73; 702/60, 62

(56) References Cited

U.S. PATENT DOCUMENTS

| | | | | |
|---|---|---|---|---|
| 4,158,810 A | * | 6/1979 | Leskovar | 324/127 |
| 4,250,449 A | * | 2/1981 | Shum | 324/142 |
| 4,384,289 A | * | 5/1983 | Stillwell et al. | 324/126 |
| 4,413,230 A | * | 11/1983 | Miller | 324/142 |
| 4,758,962 A | * | 7/1988 | Fernandes | 324/127 |
| 5,391,983 A | * | 2/1995 | Lusignan et al. | 324/142 |

OTHER PUBLICATIONS

Description of KT® 6300, 6400 Split–Core kW/kWH Transducers . . . Enercept KT®, 1 page by Hawkeye® (by Veris Industries, Inc.), at least on year prior to filing date (1997) (unavailable month).

* cited by examiner

Primary Examiner—Vinh P. Nguyen
(74) Attorney, Agent, or Firm—Kevin L. Russell of Chernoff, Vilhauer, McClung & Stenzel, LLP

(57) ABSTRACT

A measurement system includes a first transformer enclosed within a first housing and magnetically linked to a first cable where the first transformer senses changing current within the first cable and in response produces a first output voltage. A second transformer is enclosed within a second housing and magnetically linked to a second cable where the second transformer senses changing current within the second cable and in response produces a second output voltage. A third transformer is enclosed within a third housing and magnetically linked to a third cable where third transformer senses a changing current within the third cable and in response produces a third output voltage. A measurement circuit is electrically connected to the combination of the first transformer to receive a first input signal representative of the first output voltage, the second transformer to receive a second input signal representative of the second output voltage, and the third transformer to receive a third input signal representative of the third output voltage. The measurement circuit calculates an output value representative of electrical power within the first, second, and third cables in response to receiving the first, second, and third input signals. The measurement circuit is enclosed within at least one of the first housing, the second housing, and the third housing.

12 Claims, 9 Drawing Sheets

THREE-PHASE ELECTRICAL POWER MEASUREMENT SYSTEM INCLUDING THREE TRANSFORMERS AND A MEASUREMENT CIRCUIT TO CALCULATE THE POWER THEREOF

BACKGROUND OF THE INVENTION

The present invention relates to a three-phase electrical power measurement system. More specifically the present invention relates to a three-phase electrical power sub-metering system including three transformers where the measurement device is enclosed within a housing surrounding one of the transformers.

Electrical power is provided to many devices, such as large motors, by three separate cables, each of which supplies a single phase of three phase-power. In an ideal system, each of the phases within the respective cable has a phase angle which is generally 120 degrees apart from the other phases. Accordingly, the total power flowing through the three cables to a three-phase load (or from a three-phase generator) is:

$$p(^t)_{3-phase} = V_p I_p * [\cos(2wt+a+\beta) + \cos(2wt+a+\beta-240) + \cos(2wt+a+\beta P-240) + \cos(2wt+a+\beta-480)] + 3*V_p I_p * \cos\phi,$$

where $V_p$ and $I_p$ represent the root-mean-square values of the phase voltages and phase currents.

Although there exists numerous devices suitable to measure the power flowing through a single conductor, these devices are not suitable to measure power flowing through multiple conductors. For example, one device for measuring power through a single conductor is produced by Veris Industries, Inc. of Portland, Ore. Veris Industries, Inc. markets a single phase power measurement device under the name KT 6300 that includes a split core transformer that encircles a cable to sense the current flowing therein. The KT 6300 also includes multiple wire leads that are connected to the one or more cables to sense the voltage therein. A measuring circuit enclosed within the housing of the transformer calculates the power flowing through the cable. Unfortunately, the KT 6300 is not capable of measuring the power usage of three-phase power systems.

An electrical power utility measures the power usage of each of its customers using a power revenue meter (normally on the exterior of each customer's building). The power revenue meter electrically interconnects the secondary service of the utility with the primary service of the customer. The electrical power used by the customer is measured by the power revenue meter and the customer is billed periodically.

The power revenue meter is normally a glass meter with a spinning disc that rotates proportionally to power usage. To install such a power revenue meter in new construction the customer routes a first three-phase cable (three separate conductors, each of which carries a single phase) from a customer's power box to a power revenue meter base for power returned from the customer to the utility. The power box is normally located within a customer's building and encloses a panel with circuit breakers for distribution of the electrical power to different electrical loads of the customer. Such loads may, for example, include lighting, motors, air conditioning systems, and pumps. A power revenue meter base is installed on the exterior of the building and the first cable is connected thereto. A second three-phase cable is connected to and routed from the power revenue meter base to the power box for supplying power used by the customer. After the two three-phase cables are properly installed, a power revenue meter is installed in the power revenue meter base. The installation of the three-phase cables and the power revenue meter (including its base) is labor intensive and incurs substantial expense.

The expense associated with installing the power revenue meter in new construction is normally included in the total construction cost.

Installation of the power revenue meter in an existing building is substantially more expensive than installation of the power revenue meter in new construction. In existing buildings, at least one hole needs to be drilled though the wall and conduit routed between the power box on the interior of the building and the power revenue meter on the exterior of the building. Also, suitable interior wall space must be located to mount the power box in a location near the power revenue meter. If suitable wall space is not available nearby then an excessive length of conduit must be installed or devices located on the nearby suitable portion of the wall need to be relocated, both of which are time intensive and expensive.

There are numerous occasions in which a customer may wish to install additional power revenue meters. For example, customers may wish to monitor power usage of particular loads using additional power revenue meters. Many companies desire to allocate their electrical power usage based on power usage by individual departments. By using multiple power revenue meters the expense for electrical power usage can be allocated and monitored at the department level. In this manner each department is responsible for payment of their own electrical power usage.

Shopping malls and marinas are examples of customers that often need to install additional power revenue meters for tenant sub-metering. In these cases, each tenant's individual power usage is individually billed to that particular tenant, as opposed to merely guessing what portion of the total power usage is attributable to each tenant. Tenant sub-metering is important when there are significant differences between the amounts of power usage by different tenants.

Another example of a customer that may need to install additional power revenue meters are universities or other multiple building institutions that desire to determine where electrical power is being wasted because many buildings have antiquated electrical systems. Monitoring power usage on an individual building basis permits the customer to renovate those portions of the institution where the resulting cost savings will pay for, at least in part, the renovations.

Sometimes multiple power revenue meters are used to isolate use of particular systems. For example, cooling systems use a substantial amount of electrical power so there is a need for installing additional power revenue meters for optimizing the cooling systems to reduce electrical power usage. When redesigning cooling systems and adjusting electrical usage of different portions of existing systems there is a trade off between the electrical power consumed by the pumps which vary the fluid flow and the electrical power consumed by the fans. A proper balance between the electrical power usage of the pumps and fans may reduce the overall power usage.

Unfortunately for most systems, such as departmental billing, tenant sub-metering, multiple building institutions, and cooling systems, the expense associated with installing additional power revenue meters does not outweigh the potential benefits to be derived therefrom.

In contrast to installing additional utility power revenue meters, a power sub-metering system may be used to provide sub-metering capability. Sub-metering involves measuring the power delivered from a customer's power box to a particular device. As opposed to installation of additional power revenue meters that are monitored by the utility company, a customer using sub-metering receives a single bill from the utility for each power revenue meter but is able to allocate the utility bill from each power revenue meter among its different uses using information provided by the sub-metering system.

A sub-metering system generally includes a separate transformer installed on each respective cable of the three cables of a three-phase system within a customer's power box containing the electrical panel. Each transformer senses a changing current within a respective cable and produces an output voltage or current proportional to the changing current. A measuring circuit is electrically connected to the three transformers and receives each of the transformer output voltages or currents. The measuring circuit is also electrically connected to the three cables by voltage "taps" to measure the voltage therein. The voltage "tap" measurements are preferably obtained by an electrical connection to the interface between each phase of the respective cable and the panel. The measuring circuit calculates the power usage of the respective three phases using the output voltages from the transformers and the voltages sensed by the three voltage "taps."

For safety reasons electrical building codes prohibit the installation of the measuring circuit in the power box, such as the power box containing the electrical panel with high voltage conductors. In order to calculate the electrical power usage, a separate measuring box must be purchased and installed in a location proximate the power box. A conduit is installed to interconnect the measuring box and the power box. The measuring circuit is then installed within the measuring box. The installation of the separate measuring box is time consuming, labor intensive, and expensive. In addition, if suitable wall space is not available for the measuring box, then relocation of other devices on the wall may be necessary at added expense. Also, each of the transformers has a pair of wires extending therefrom which are routed through the conduit to the measuring circuit in the measuring box, and a set of three wires connected to the voltage "taps" are likewise routed through the conduit to the measuring circuit in the measuring box. Accordingly, at least nine wires need to be routed between the power box and the measuring box. Installers of the sub-metering system have a tendency to become confused as to where each wire originated and frequently connect the wires improperly. If the wires are improperly connected then the measuring circuit will improperly calculate the power usage. Also, it is time consuming to verify which wires are connected to which cables within the two separate boxes.

What is desired, therefore, is a cost effective sub-metering system for a three-phase system that is inexpensive, is quick to install, does not require installation of additional enclosures, and is not prone to improper connections.

BRIEF SUMMARY OF THE INVENTION

The present invention overcomes the aforementioned drawbacks of the prior art by providing a measurement system that includes a first transformer enclosed within a first housing and magnetically linked to a first cable where the first transformer senses changing current within the first cable and in response produces a first output voltage. A second transformer is enclosed within a second housing and magnetically linked to a second cable where the second transformer senses changing current within the second cable and in response produces a second output voltage. A third transformer is enclosed within a third housing and magnetically linked to a third cable where third transformer senses a changing current within the third cable and in response produces a third output voltage. A measurement circuit is electrically connected to the combination of the first transformer to receive a first input signal representative of the first output voltage, the second transformer to receive a second input signal representative of the second output voltage, and the third transformer to receive a third input signal representative of the third output voltage. The measurement circuit calculates an output value representative of electrical power within the first, second, and third cables in response to receiving the first, second, and third input signals. The measurement circuit is enclosed within at least one of the first housing, the second housing, and the third housing.

One of the principal advantages of the measuring system is that the measuring circuit is enclosed within one of the housings. Electrical building codes permit the measuring circuit to then be located within a power box. By locating all three transformers and the measuring circuit within the power box, while being in compliance with the electrical building codes, there is no need to install an additional measuring box and conduit thereto. Without the need to purchase and install an additional measuring box, there is no need to relocate any devices supported by the wall that would have been otherwise prevented installation of the measuring box. The likelihood of improperly connecting the transformers and wires with the proper cables is small because all the wires are contained within a single enclosure, namely the power box, and not obscured from view by passing through a conduit.

The foregoing and other objectives, features, and advantages of the invention will be more readily understood upon consideration of the following detailed description of the invention, taken in conjunction with the accompanying drawings.

DETAILED DESCRIPTION OF THE PREFERRED EMBODIMENT

Figure 1:
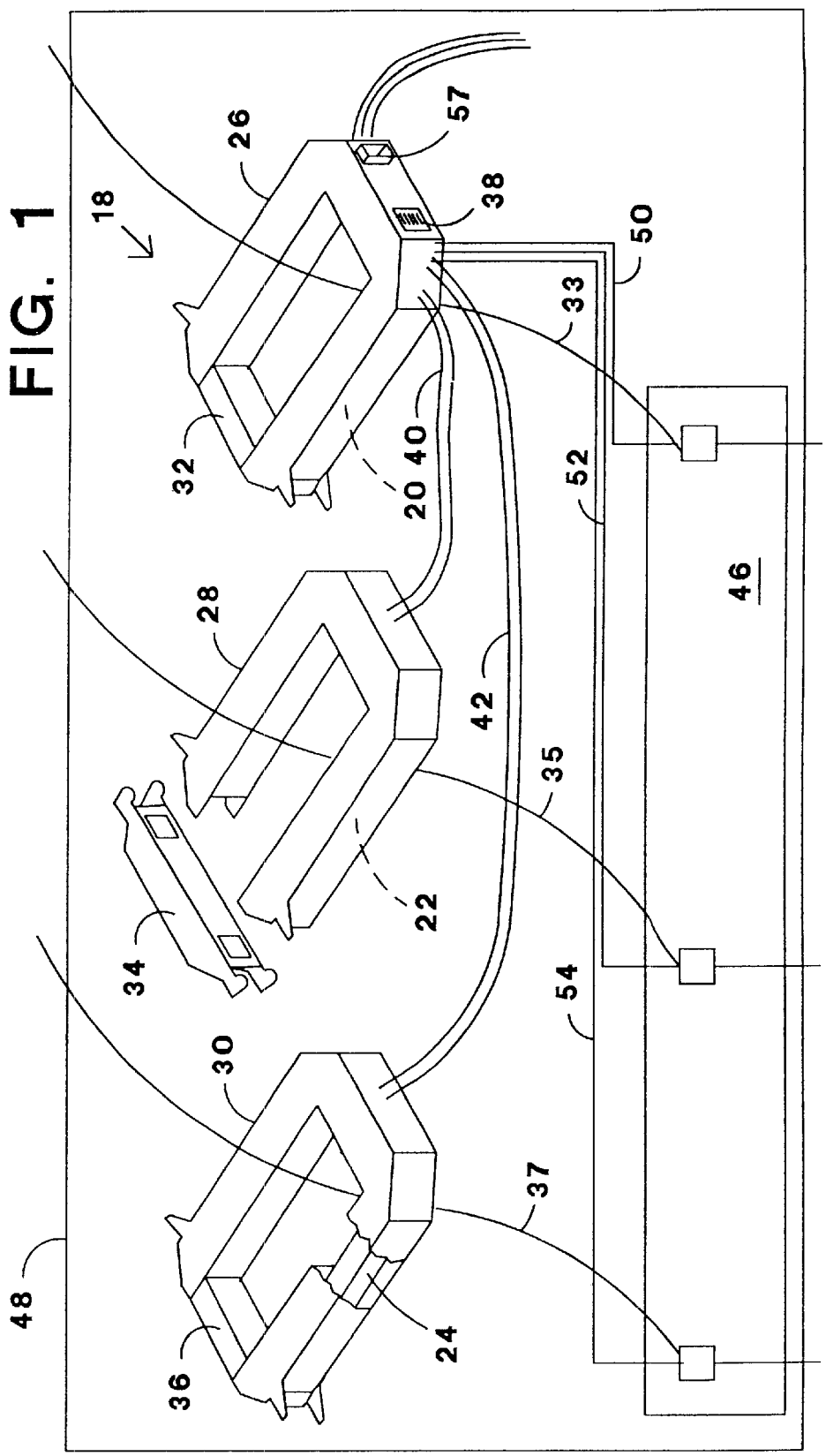
FIG. 1 is a pictorial view of an exemplary embodiment of a three phase electrical power measurement system including three transformers, a measurement circuit, a panel, all of which are enclosed within a power box.

Referring to FIG. 1, a three-phase sub-metering system 18 includes a set of three split core transformers 20, 22, and 24. Each of the transformers 20, 22, and 24 is enclosed within a respective housing 26, 28, and 30. End portions 32, 34, and 36 of each respective housing enclose a portion of the respective transformer 20, 22, and 24. The end portions 32, 34 and 36 are hingably attached so that the transformers 20, 22, and 24 (or housings) can be installed around respective cables 33, 35, and 37 of a three-phase system by simply opening the end portions 32, 34, and 36, locating the respective cable 33, 35, and 37 within, and closing the end portions 32, 34, and 36. A measuring circuit 38 is located within the housing 26 of transformer 20 to calculate the power sensed by the three-phase sub-metering system 18. Transformers 22 and 24 are electrically connected to the measuring circuit 38 by respective pairs of wires 40 and 42.

Figure 2:
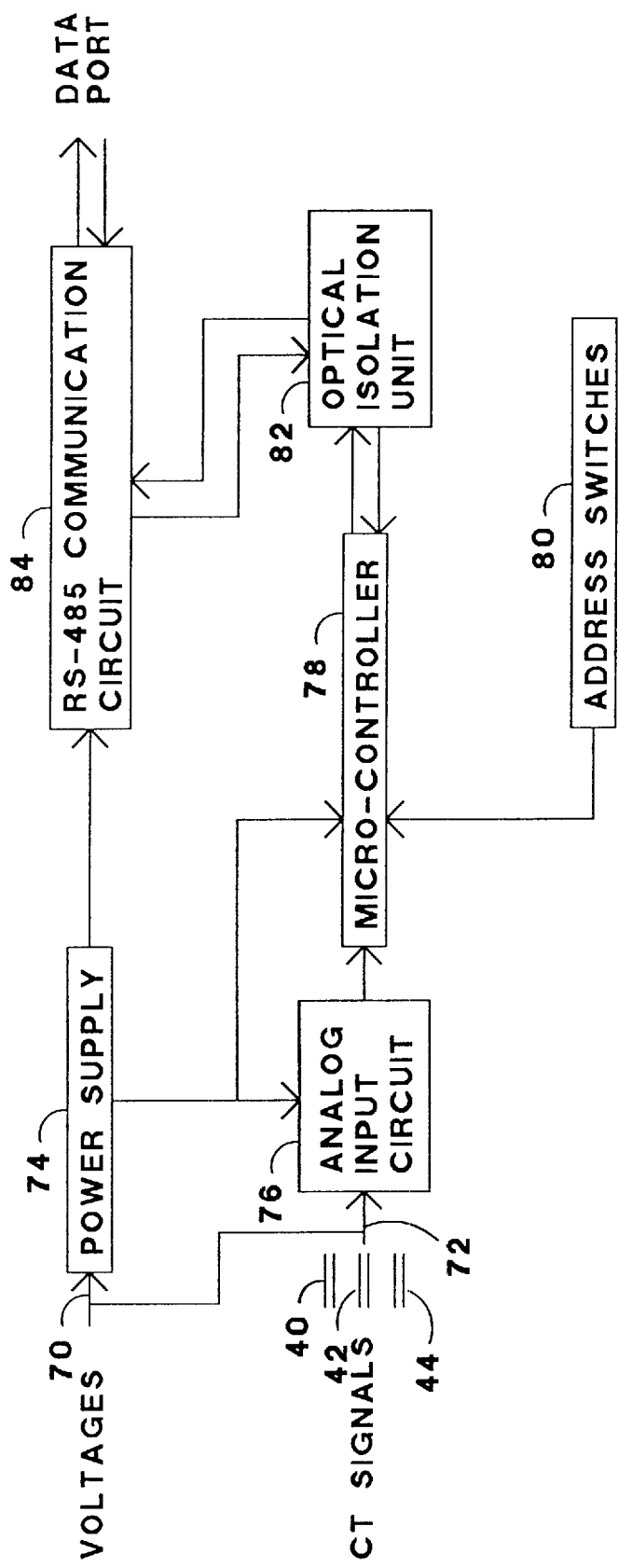
FIG. 2 is a block diagram of the measurement circuit of FIG. 1.
Figure 3:
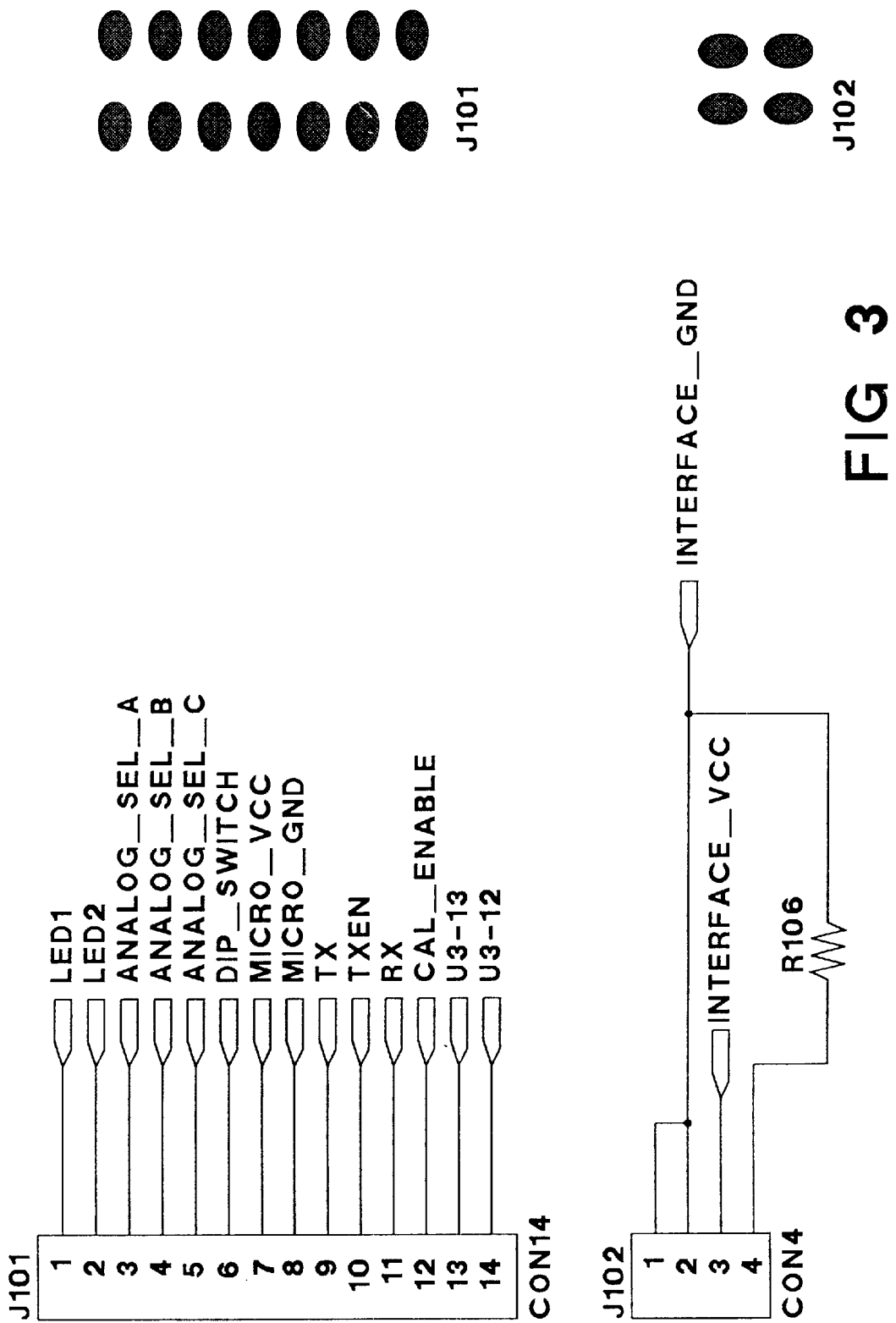
FIGS. 3–9 are circuit diagrams for the measurement circuit of FIG. 2.
Figure 4:
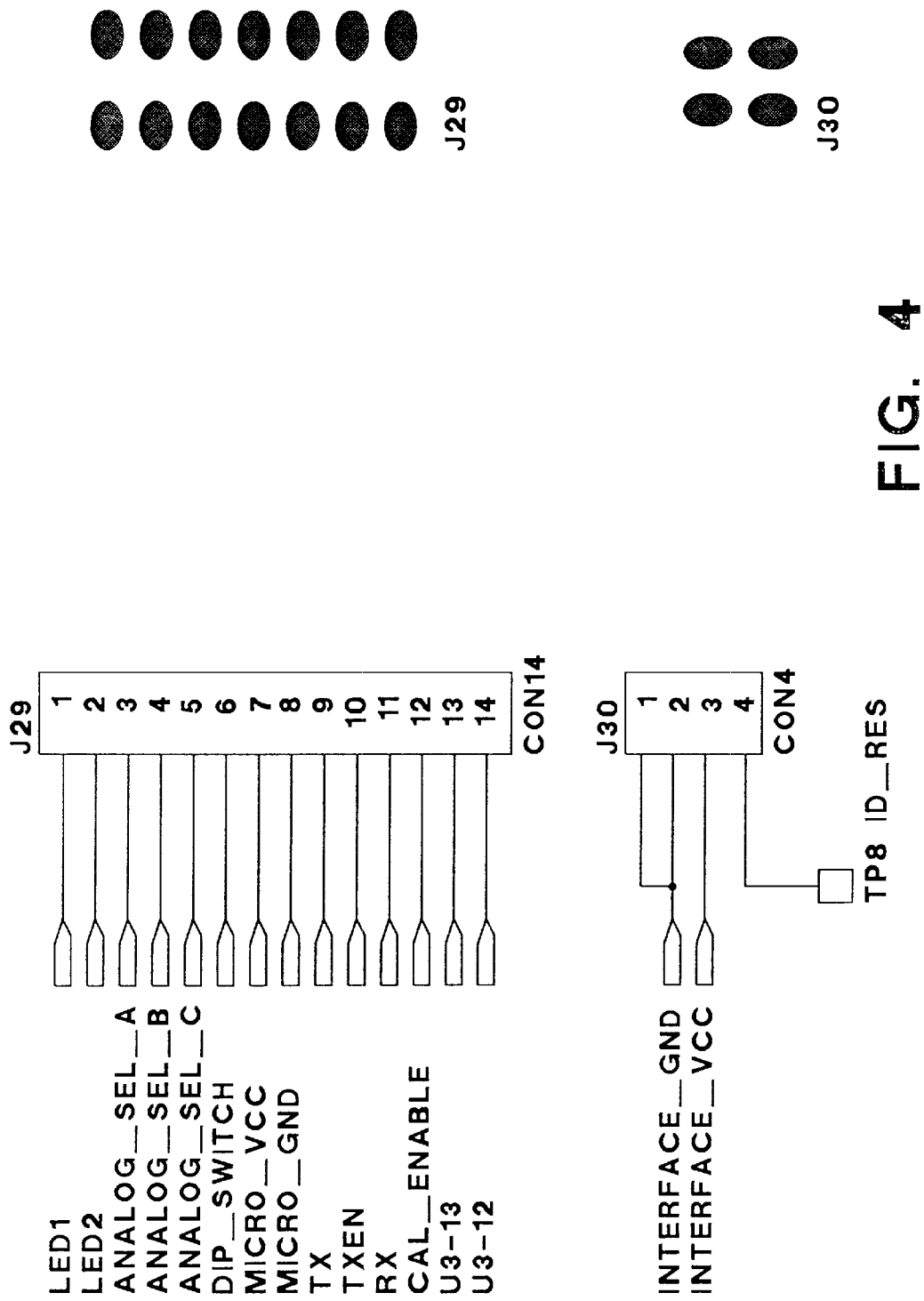
Figure 5:
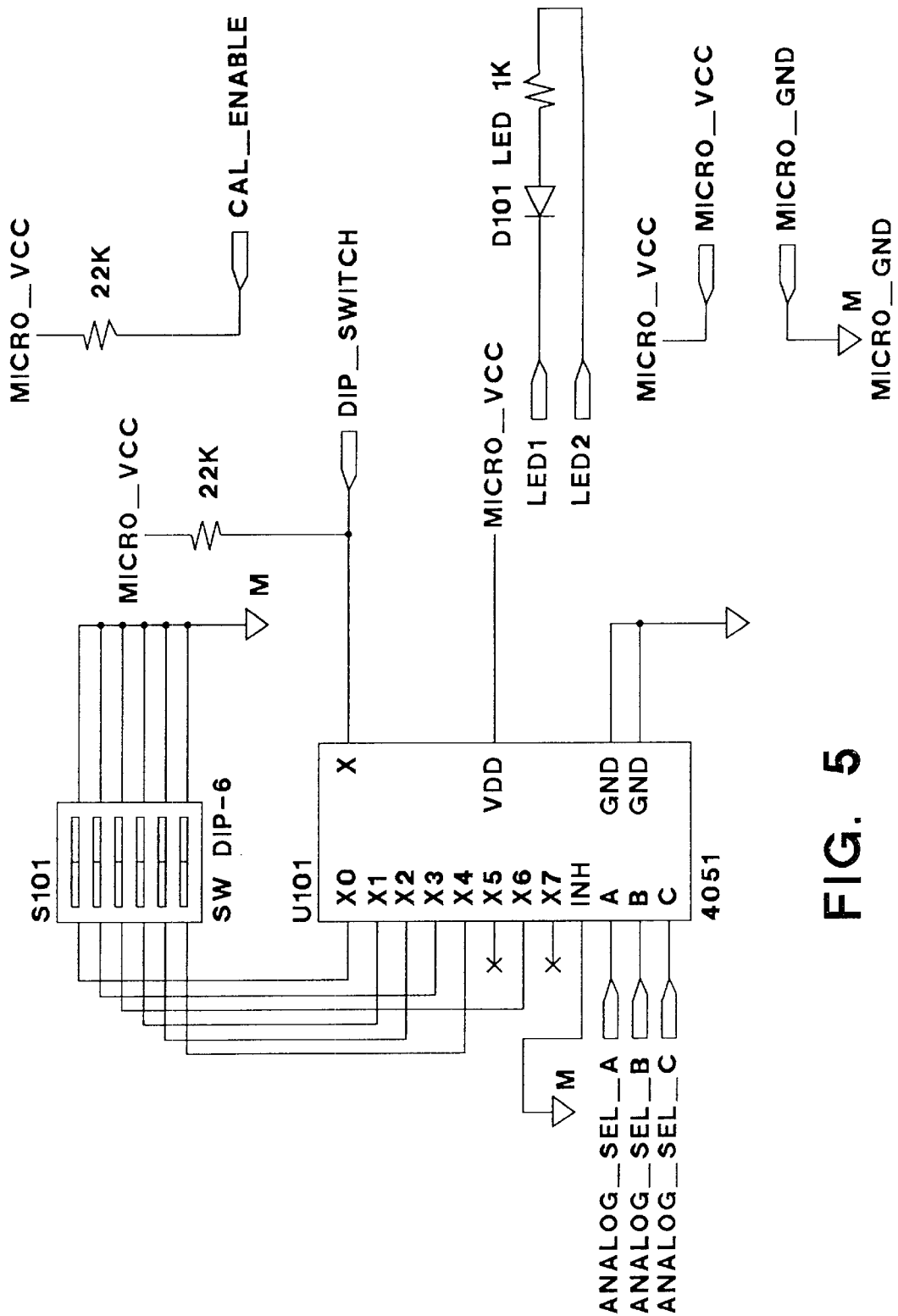
Figure 6:
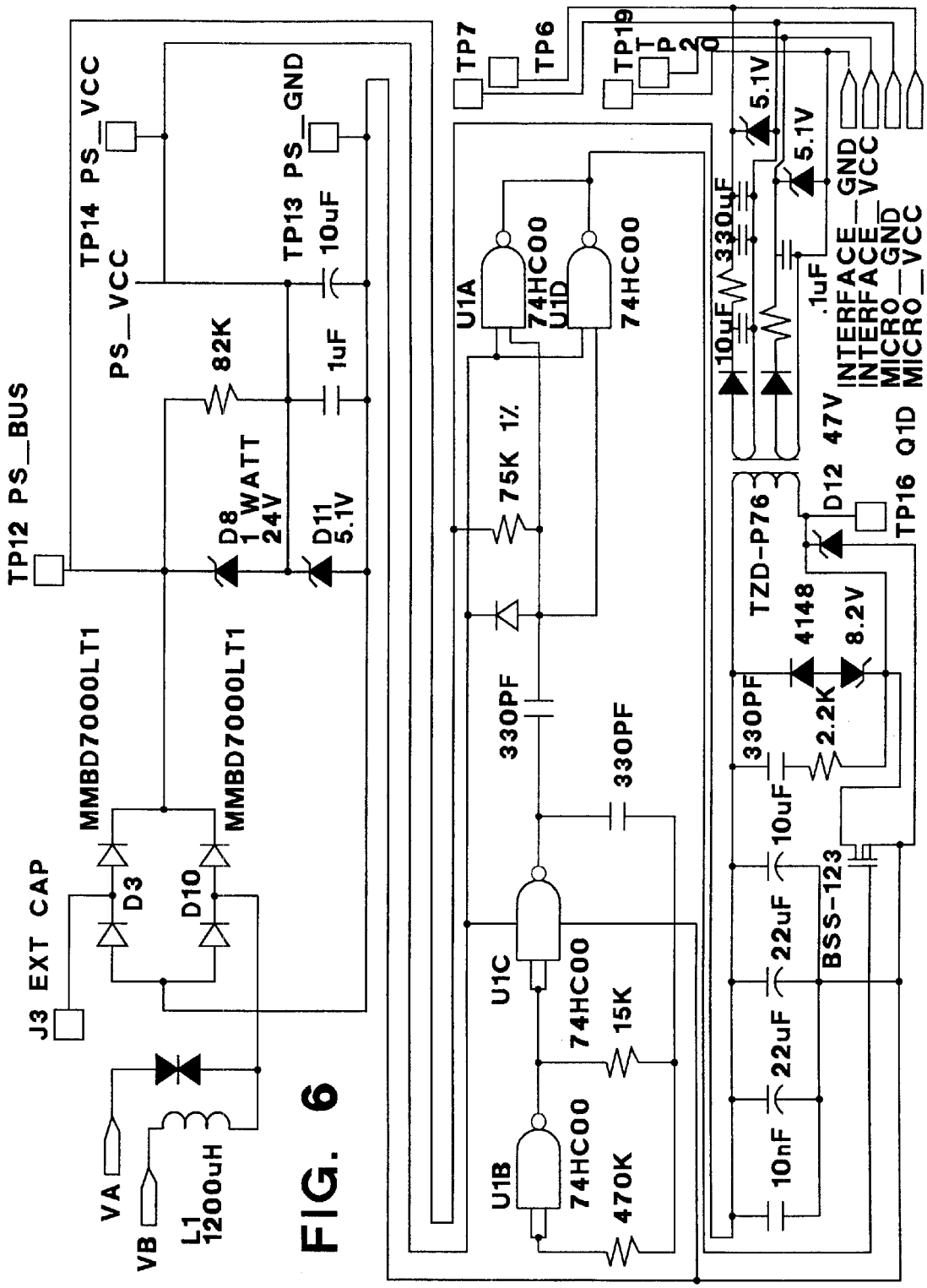
Figure 7:
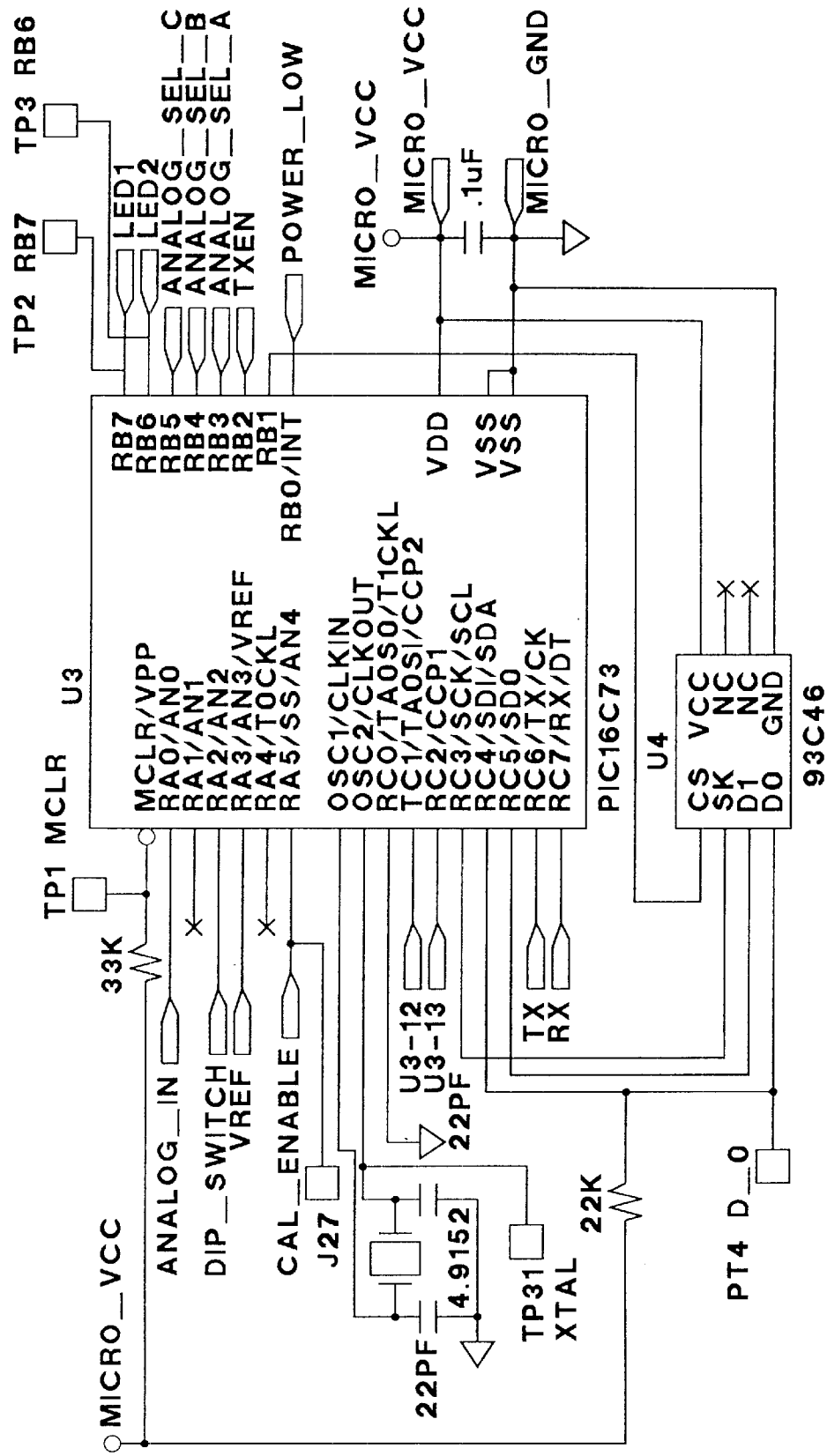
Figure 8:
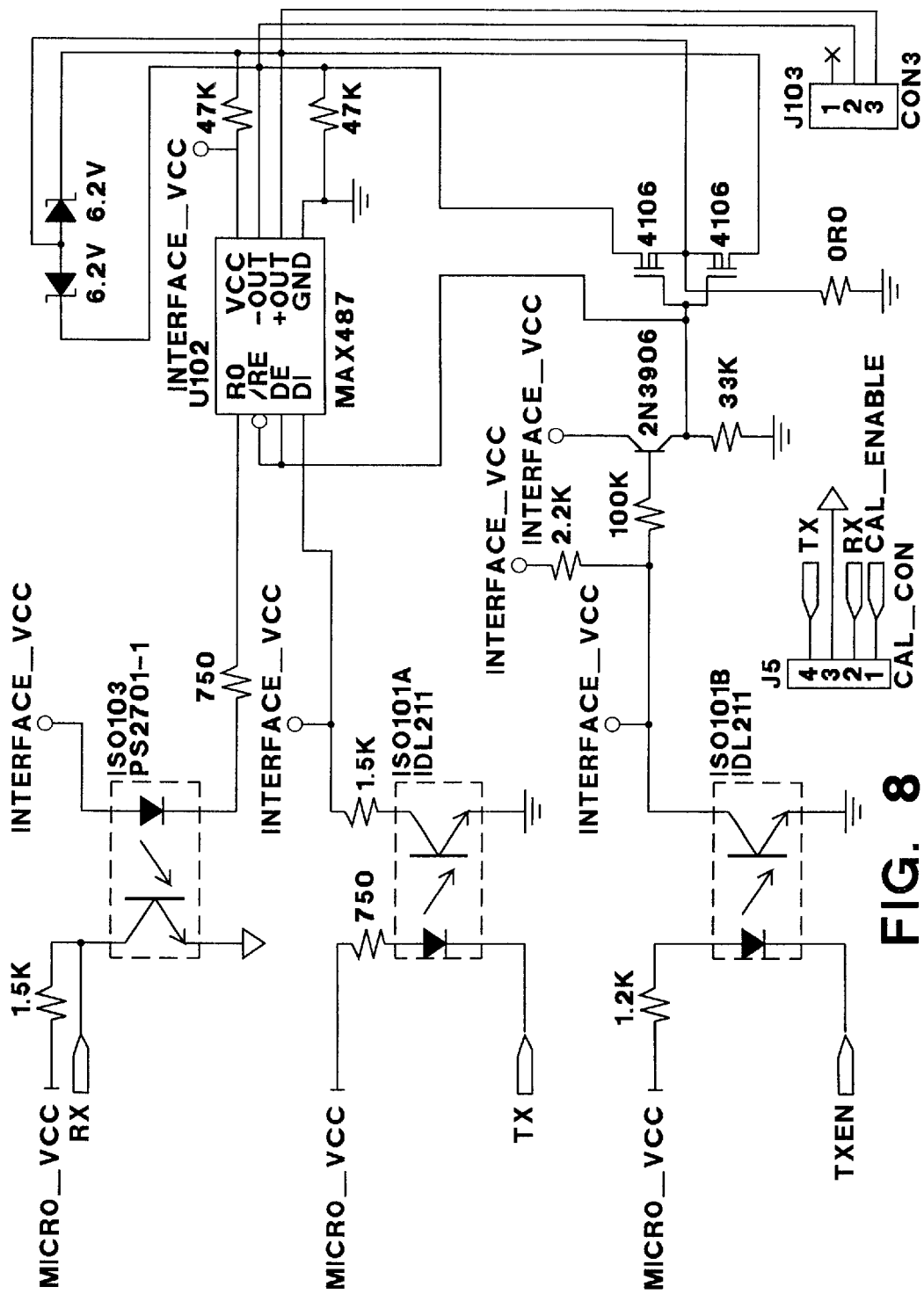
Figure 9:
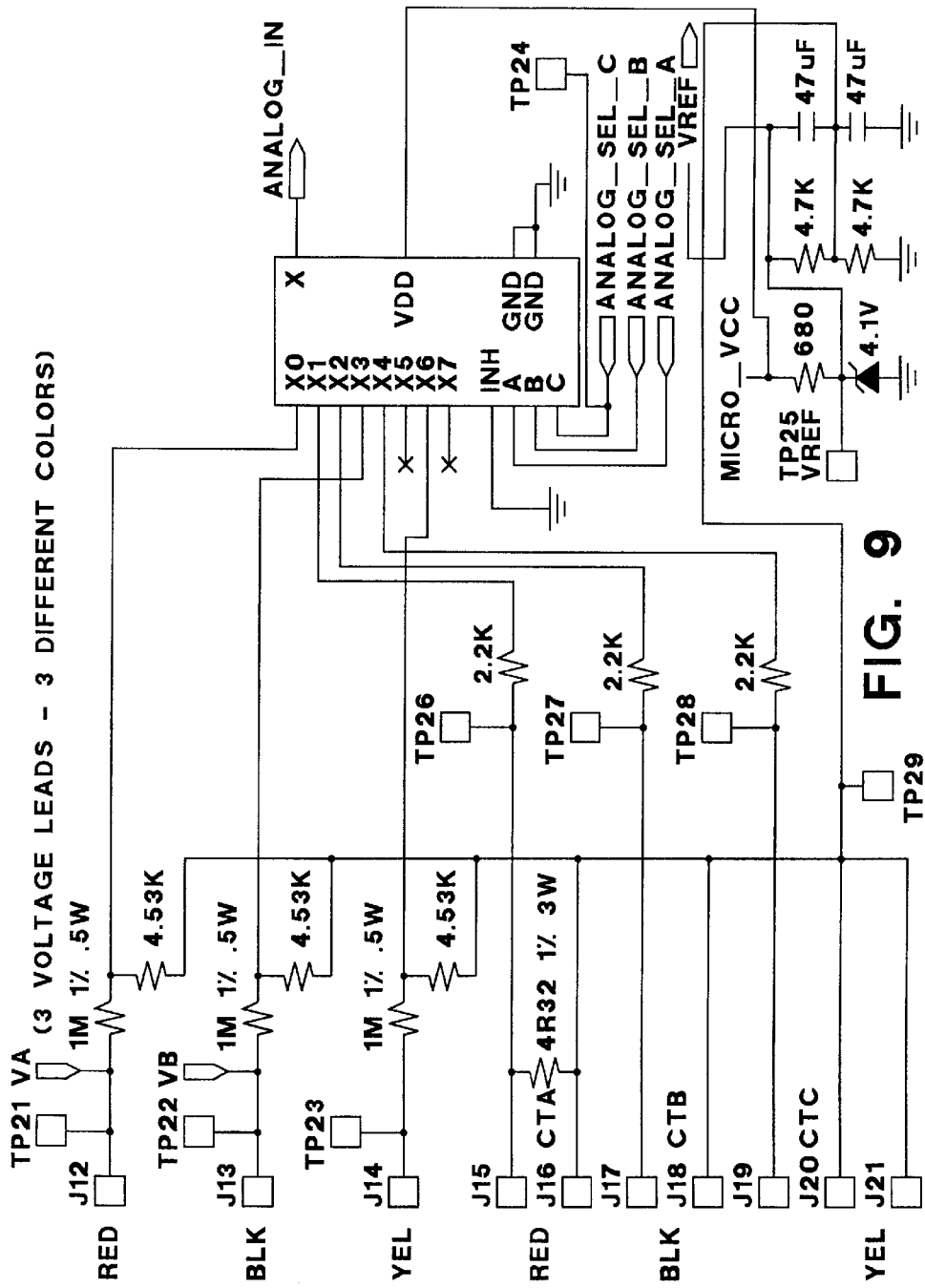

Transformer 20 is electrically connected to the measuring circuit 38 by a pair of wires 44 within the housing 26 (see FIG. 2).

A set of three wire leads 50, 52, and 54 is electrically connected to the measuring circuit 38 and each wire lead 50, 52 and 54 corresponds to a respective one the transformers 20, 22, and 24. The wire leads 50, 52, and 54 are preferably connected to the electrical interconnection between the respective cables 33, 35, and 37 and an electrical panel 46. In other words, wires 42 are associated with wire lead 54, wires 40 are associated with wire lead 52, and wires 44 are associated with wires 44, such that the current and voltage sensed within each cable are properly paired together.

The sub-metering system 18 is preferably installed within a power box 48. The output of each transformer 20, 22, and 24 is a voltage signal representative of the level of the changing current of the respective cable 33, 35, and 37 enclosed therein. Likewise, the corresponding three wire leads 50, 52, and 54 provide a voltage signal representative of the voltage level within the respective cable to the measuring circuit 38. The measuring circuit 38 receives the voltage signals from the three transformers 20, 22, and 24 and the voltage signals from the three wire leads 50, 52, and 54 and calculates the power flowing through the three-phase system.

One of the principal advantages of the three-phase sub-metering system 18 is that the measuring circuit 38 is enclosed within the housing 26. Electrical building codes permit the measuring circuit to then be located within the power box 48. By locating all three transformers 20, 22, and 24 and the measuring circuit 38 within the power box 48, while being in compliance with the electrical building codes, there is no need to install an additional measuring box and conduit thereto. Without the need to purchase and install an additional measuring box, there is no need to relocate any devices supported by the wall that would have otherwise prevented installation of the measuring box. The likelihood of improperly connecting the transformers 20, 22, and 24 and wires 50, 52, and 54 with the proper cables 33, 35, and 37 is small because all the wires are contained within a single enclosure, namely the power box 38, and not obscured from view by passing through a conduit.

Using a set of three separate split core transformers 20, 22, and 24 permits the sub-metering system 18 to be installed on existing cables without disconnecting the wires from the panel 46 to route the wires through the center of the transformers 20, 22, and 24. This allows the connection of the sub-metering system 18 to cables that are energized and would otherwise potentially electrocute the technician installing the sub-metering system 18.

At least one of the pairs of wires 40 preferably includes a first exterior pattern or color, such as yellow, that is different than a second exterior pattern or color, such as black, of at least another one of the pairs of wires 42. The wire lead 54 preferably has a color or pattern, such as yellow, that matches the pattern or color of at least one of the pair of wires 42. The wire lead 52 preferably has a color or pattern, such as black, that matches the pattern or color of at least one of the pair of wires 40. The wire 50 preferably has a pattern or color that does not match any pattern or color of any of the wires 52 or 54. With at least one of the wires 42 matching the wire 54 and at least one of the wires 40 matching the wire 52, where the combination of wire 54 and at least one of the wires 42, combination of wire 52 and at least one of the wires 40 and wire 50 all have different exterior appearances from one another a technician installing the system can easily visually verify that the wires 50, 52, and 54 are properly connected.

By connecting the wires 40, 42 and 44 to a measuring circuit 38 within the housing 26 all the transformers are installed without any possibility of improperly connecting such wires. The remaining three wires 50, 52, and 54 are electrically connected to the suitable cable 33, 35, and 37, which is the only portion of the sub-metering system 18 that is subject to improper connection. This arrangement of wiring minimizes potential errors by technicians, especially with the assistance of different exterior appearances of the wires, as previously described, in combination with the use of a single power box.

The measuring circuit 38 provides a network data communication output 57 so that the power readings can be read by a remote computer. In addition each of the measuring circuits may be assigned a unique number and the sub-metering systems 18 daisy chained together so that multiple sub-metering systems 18 can be monitored through one network data communication output.

The measuring circuit 38 is designed to provide the following output values:

Kilowatts (kW);
Kilowatt hours (kWH)
Apparent Power (VA)
Phase A kilowatts (kW)
Phase B kilowatts (kW)
Phase C kilowatts (kW)
System power factor (%)
Phase A power factor (%)
Phase B power factor (%)
Phase C power factor (%)
Reactive power (KVAR)
Phase A amperage (rms)
Phase B amperage (rms)
Phase C amperage (rms)
Phase A minus Phase C volts (rms)
Phase A minus Phase B volts (rms)
Phase B minus Phase C volts (rms)

Referring to FIG. 2, a block diagram of the measuring circuit 38 includes three voltage inputs 70 from the three wires 33, 35, 37 and six voltage inputs 72 from the six wires 40, 42, and 44. The voltage inputs 70 provide power to a switching power supply 74 which in turn provides a 5 volt output to the remainder of the measuring circuit 38. The voltage inputs 70 and 72 are received by an analog input circuit 76 which multiplexes corresponding sets of voltage inputs 70 and 72. The analog inputs are scaled to an appropriate range for digital micro-controller 78. The micro-controller 78 receives the output of the analog input circuits 76 and converts it to digital values with a set of analog-to-digital converters. A set of calibration data modifies the digital values obtained for increased accuracy. The micro-controller 78 calculates all of the calculations, as previously discussed. A set of address switches 80 allow each sub-metering system 18 to have an individual address set by the user. An optical isolation unit 82 provides data to a RS-485 communication circuit 84 for transmission to a remote unit, such as a personal computer.

FIGS. 3–9 illustrate an exemplary circuit layout for two circuit boards connected to one another for the measuring circuit 38.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A measurement system comprising:

(a) a first transformer enclosed within a first housing and magnetically linked to a first cable, said first transformer sensing changing signal within said first cable and in response producing a first output signal;

(b) a second transformer enclosed within a second housing and magnetically linked to a second cable, said second transformer sensing changing signal within said second cable and in response producing a second output signal;

(c) a third transformer enclosed within a third housing and magnetically linked to a third cable, said third transformer sensing changing signal within said third cable and in response producing a third output signal;

(d) a measurement circuit electrically connected to the combination of said first transformer to receive a first input signal representative of said first output signal, said second transformer to receive a second input signal representative of said second output signal, and said third transformer to receive a third input signal representative of said third output signal;

(e) said measurement circuit calculating an output value representative of electrical power within said first, second, and third cables in response to receiving said first, second, and third input signals;

(f) said measurement circuit enclosed within at least one of said first housing, said second housing, and said third housing; and said first housing, said second housing, and said third housing free from being maintained in a rigid relationship with respect to each other.

2. The measurement system of claim 1 wherein said first transformer includes a split core.

3. The measurement system of claim 2 wherein said split core includes two portions that are hingably attached to one another.

4. The measurement system of claim 1 wherein said first output signal and said second output signal are approximately 120 degrees apart, said second output signal and said third output signal are approximately 120 degrees apart, and said third output signal and said first output signal are approximately 120 degrees apart.

5. The measurement system of claim 1 wherein said first, second, and third transformers are located within a power box containing an electrical panel.

6. The measurement system of claim 1 wherein, (a) said measurement circuit is enclosed within said third housing;

(b) said first transformer is electrically connected to said measurement circuit by a first pair of wires;

(c) said second transformer is electrically connected to said measurement circuit by a second pair of wires; and (d) at least one of said first pair of wires having an exterior appearance that is different than at least one of said second pair of wires.

7. The measurement system of claim 6 wherein, (a) a third wire is directly electrically connected to said first cable;

(b) a fourth wire is directly electrically connected to said second cable;

(c) a fifth wire is directly electrically connected to said third cable;

(d) said third wire having an exterior appearance that matches at least one of said first pair of wires;

(e) said fourth wire having an exterior appearance that matches at least one of said second pair of wires; and (f) said fifth wire having an exterior appearance that is different than the exterior appearances of said third wire and said fourth wire.

8. A method of measuring power usage comprising the steps of:

(a) locating a first transformer enclosed within a first housing and magnetically linked to a first cable within a power box where said first transformer senses a changing signal within said first cable and in response produces a first output signal;

(b) locating a second transformer enclosed within a second housing and magnetically linked to a second cable within said power box where said second transformer senses a changing signal within said second cable and in response produces a second output signal;

(c) locating a third transformer enclosed within a third housing and magnetically linked to a third cable within said power box where said third transformer senses a changing signal within said third cable and in response produces a third output signal;

(d) receiving in a measurement circuit a first input signal representative of said first output signal from said first transformer, a second input signal representative of said second output signal from said first transformer, and a third input signal representative of said third output signal from said third transformer;

(e) said measurement circuit calculating an output value representative of electrical power flowing within said first, second, and third cables in response to receiving said first, second, and third input signals;

(f) locating said measurement circuit within at least one of said first housing, said second housing, and said third housing; and (g) maintaining said first housing, said second housing, and said third housing free from a rigid relationship with respect to each other.

9. The method of claim 8 wherein said first transformer includes a split core.

10. The method of claim 9 wherein said split core includes two portions that are hingably attached to one another.

11. The method of claim 8 wherein said first output signal and said second output signal are approximately 120 degrees apart, said second output signal and said third output signal are approximately 120 degrees apart, and said third output signal and said first output signal are approximately 120 degrees apart.

12. The method of claim 8 wherein said first, second, and third transformer are located within said power box including an electrical panel.

* * * * *